(12) United States Patent
Park

(10) Patent No.: US 7,393,742 B2
(45) Date of Patent: Jul. 1, 2008

(54) SEMICONDUCTOR DEVICE HAVING A CAPACITOR AND A FABRICATION METHOD THEREOF

(75) Inventor: Won-Mo Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 216 days.

(21) Appl. No.: 11/357,832

(22) Filed: Feb. 17, 2006

(65) Prior Publication Data
US 2006/0186453 A1    Aug. 24, 2006

(30) Foreign Application Priority Data
Feb. 21, 2005    (KR) .................... 10-2005-0014242

(51) Int. Cl.
*H01L 21/8242* (2006.01)
(52) U.S. Cl. ................ 438/253; 438/239; 438/240; 438/244; 438/254; 438/255; 438/256; 438/396; 438/398; 438/399; 257/E21.018; 257/E21.019
(58) Field of Classification Search ........... 438/244, 438/254, 256, 387, 399, 657
See application file for complete search history.

(56) References Cited

U.S. PATENT DOCUMENTS 6,329,683 B2    12/2001    Kohyama ............... 257/306

2004/0248361 A1 *   12/2004   Oh et al. ................ 438/240

FOREIGN PATENT DOCUMENTS

| KR | 1999-005486 | 1/1999 |
| KR | 10-2003-0052760 | 6/2003 |
| KR | 10-2004-0008904 | 1/2004 |

\* cited by examiner

Primary Examiner—Michael S. Lebentritt
Assistant Examiner—Kyoung Lee
(74) Attorney, Agent, or Firm—Mills & Onello LLP

(57) ABSTRACT

In a semiconductor device having a capacitor and a method of fabricating the same, the semiconductor device comprises a semiconductor substrate and an insulating layer on the semiconductor substrate, a contact plug electrically connected to the semiconductor substrate and formed in the contact hole, a buffer conductive layer pattern electrically connected to the contact plug and formed on the insulating layer and the contact plug, an etching stopping layer formed on the buffer conductive layer pattern, a gap between the buffer conductive layer pattern and the etching stopping layer, a capacitor lower electrode electrically connected to the buffer conductive layer pattern and formed on the buffer conductive layer pattern. The gap is filled by a portion of the capacitor lower electrode.

16 Claims, 15 Drawing Sheets

SEMICONDUCTOR DEVICE HAVING A CAPACITOR AND A FABRICATION METHOD THEREOF

RELATED APPLICATION

This application relies for priority on Korean Patent Application number 10-2005-0014242, filed in the Korean Intellectual Property Office on Feb. 21, 2005, the contents of which are incorporated herein in their entirety by reference.

BACKGROUND OF THE INVENTION

1. Field of the Invention

The present invention relates to a semiconductor device and a fabrication method thereof. More particularly, this application relates to a semiconductor device having a capacitor and a fabrication method thereof.

2. Description of the Related Art

Generally, semiconductor memory devices, in particular, dynamic random access memory (DRAM) devices, have capacitors for storing data in unit cells. More particularly, a unit cell of a DRAM device consists of a cell capacitor and an access transistor which is directly connected to the cell capacitor.

However, corresponding to the continuous increase of the semiconductor device's integration density, the unit cell area has been decreased dramatically. As a result of the decreased capacitor size, the capacitance of the unit cell capacitor becomes smaller. This results in a decrease of the capability for storing a data in a unit cell. Specifically, sometimes the unit cell may lose the data which was stored in the cell, and the memory device may make functional errors. Therefore, capacitance of a unit cell capacitor must be maintained in order to maintain proper device function in a high density device.

It is well known to increase surface area of a unit cell capacitor's storage node to increase capacitance of the unit cell capacitor. For example, in the case of a stacked storage node or a cylindrical storage node, the capacitance of the unit cell can be increased by increasing the height of the unit cell capacitor.

However, increasing the height of the storage node can result in several problems. For example, as the height of the storage node is increased, it may be very difficult to pattern conductive layers as storage nodes. Also, electrical bridges between adjacent storage nodes will be increased significantly due to leaning phenomena of the storage nodes.

A cylindrical capacitor storage node and a fabrication method are described in U.S. Pat. No. 6,329,683 by Kohyama et al., entitled "Semiconductor Memory Device and Manufacturing Method Thereof Which Make it Possible to Improve Reliability of Cell-Capacitor and Also to Simplify the Manufacturing Processes."

Kohyama et al. described a semiconductor memory device having a cylinder type storage node and a manufacturing method thereof. In Kohyama, et al., an isolation region defining active regions is formed on a semiconductor substrate. Each of the active regions has a major axis and a minor axis, and the active regions are separated by a given distance. An insulating layer is formed on the semiconductor substrate. Contact plugs which are connected to the active regions are formed in the insulating layer. Cylinder type storage nodes having an elliptical shape and protruding from the contact plugs are formed on the contact plugs.

Major axes of the above elliptical cylinder storage nodes are parallel to the major axes of the active regions. However, because of the increase of the devices' density, the space between the minor axes of the capacitor storage nodes may be narrower. As a result, the possibility of a bridge being formed between the storage nodes increases. Therefore, recently, a circle type storage node instead of the elliptical type storage node has been suggested.

Unfortunately, the circle type storage node has less capacitance than the elliptical type storage node because total surface area of the circle type storage node is lower than that of the elliptical type storage node.

Therefore, now, in order to increase the surface area of the capacitor storage node and to prevent the electrical bridge, the storage nodes may be formed having a portion which is not connected to the contact plugs at their bottom surface. As a result, a buffer conductive layer is formed on the contact plug to increase the contact area between the storage nodes and the contact plugs.

FIGS. 1A through 1E are cross-sectional views illustrating a conventional method of fabricating a semiconductor device having a cylindrical storage node.

Referring to FIG. 1A, an insulating layer 105 is formed on a semiconductor substrate 100. A contact hole 110 is formed in the insulating layer to expose a portion of the semiconductor substrate by patterning the insulating layer. A conductive layer made of polysilicon is formed on the insulating layer and in the contact hole. A contact plug 115a is formed in the insulating layer, and a buffer conductive pattern 115b is formed on the insulating layer 105 and the contact plug 115a by patterning the conductive layer. The buffer conductive pattern 115b prevents a bad contact profile between the contact plug 115a and a storage node which will be formed on the contact plug 115a.

Referring to FIG. 1B, an etching stopping layer 125 made of silicon nitride is formed on the insulating layer 105 and the buffer conductive layer 115b. A first mold layer 130 and a second mold layer 135 are formed on the etching stopping layer 125. The first mold layer 130 should have a different and higher etching rate compared with the second mold layer 135. For example, if the first mold layer 130 is a BPSG (Boron Phosphorous Silicate Glass) layer, the second mold layer 135 may be a PE-TEOS (Plasma Enhanced-Tetraethylortho Silicate) layer.

A storage node contact hole 140 is formed to expose the buffer conductive layer 115b by patterning the first and second mold layers 130, 135 and the etching stopping layer 125. A portion of the bottom area of the storage node contact hole 140 is not formed on the buffer conductive layer 115b such that the buffer conductive layer 115b is at least partially exposed.

Referring to FIG. 1C, the semiconductor substrate having the storage node contact hole 140 is cleaned with a cleaning chemical solution. A natural oxide layer and any defects which are formed on the surface of the buffer conductive layer are removed by the cleaning process. Generally, the cleaning chemical solution comprises Hydrogen Fluoride (HF). Thus, the first and second mold layers 130, 135 are also etched isotropically by the cleaning chemical solution. The first mold layer 130 is etched more than the second mold layer 135 because the first mold layer 130 has a higher etching rate in the HF chemical solution than the second mold layer 135. Accordingly, an enlarged storage node contact hole 140a is formed in the first mold layer 130. The enlarged storage node contact hole 140a is relatively close to the etching stopping layer 125 formed on an adjacent buffer conductive layer 140 as illustrated in the circle W1 of FIG. 1 C. The proximity of the storage node contact hole 140a is affected by the duration of the cleaning process. Generally, the longer the cleaning process is performed, the greater amount the first mold layer 130 is etched, and, therefore, the smaller the gap between the etching stopping layer 125 formed on the adjacent buffer conductive layer 115b and a storage node layer which will be formed the conductive layer will be.

A storage node layer 145 is formed on the second mold layer 135 and the storage node contact. The storage node layer 145 generally consists of a polysilicon layer having a good deposition characteristic. A passivation layer 150 is formed on the storage node layer 145 to fill in the storage node contact. The passivation layer 150 is an oxide layer, a BPSG (Boron Phosphorus Silicate Glass) layer, or a PSG (Phosphorous Silicate Glass).

Referring to FIG. 1D, a planarizing process is performed to form storage nodes 145a which are separated from each other by polishing or etching the passivation layer 150 until the second mold layer 135 is exposed.

Referring to FIG. 1E, the first and second mold layers 130, 135 and the passivation layer 150 are removed to expose the inner and outer sidewall of the storage nodes 145a. A dielectric layer 155 is formed on the surface of the storage nodes 145a. As shown in the circle W2 of FIG. 1E, the dielectric layer 155 formed on the storage nodes can be connected to the adjacent dielectric layer formed on adjacent buffer conductive layer 115b.

It is also possible for the storage nodes 145a to be connected to the etching stopping layer 125 when the first and second mold layers 130, 135 and the passivation layer 150 are removed if the storage nodes 145a lean to the etching stopping layer 125 formed on the adjacent buffer conductive layer 115b. Hence, in this case, the capacitance of each storage node will be reduced because the total surface area of each storage node 145a is reduced. The thickness of the storage nodes 145a may be reduced to prevent the dielectric layer 155 formed on the storage nodes 145a from connecting to the adjacent dielectric layer 155 formed on the adjacent buffer conductive layer 115b. Unfortunately, in this case, the storage nodes can easily lean by a large amount. Because of these and other problems, improved storage node structures and methods of forming the same are required.

SUMMARY OF THE INVENTION

The present invention provides a semiconductor memory device having a new capacitor lower electrode structure and a method of forming the same.

It is a feature of the present invention to provide a semiconductor memory device having a capacitor, wherein the capacitor has a gap between a buffer conductive layer and an etching stopping layer. A portion of a capacitor lower electrode may be formed in the gap.

It is another feature of the present invention to provide a method of fabricating a semiconductor memory device having a capacitor by forming a sacrificial layer between a buffer conductive layer and an etching stopping layer.

According to one aspect, the invention is directed to a semiconductor device having a capacitor that includes an insulating layer having a first contact hole on a semiconductor substrate. A contact plug is electrically connected to the semiconductor substrate and is formed in the contact hole. A buffer conductive layer pattern is electrically connected to the contact plug and is formed on the insulating layer and the contact plug. An etching stopping layer is formed on the buffer conductive layer pattern. A gap is located between the buffer conductive layer pattern and the etching stopping layer. A capacitor lower electrode is electrically connected to the buffer conductive layer pattern and formed on the buffer conductive layer pattern. The gap is filled by a portion of the capacitor lower electrode.

The semiconductor substrate may be a bulk silicon wafer, a silicon-on-insulator (SOI) substrate, a silicon germanium-on-insulator (SGOI) substrate, or a SiGe wafer.

The capacitor lower electrode may be a cup-shaped storage node or a cylindrical storage node. The storage node may comprise a polysilicon layer. The contact plug and the buffer conductive layer pattern may comprise the same material, for example, a polysilicon layer. The etching stopping layer may comprise a silicon nitride layer. The conductive layer may comprise at least one of W and SiGe.

The second insulating layer may comprise at least one of PE-TEOS (Plasma Enhanced Tetraethyl Orthosilicate), BPSG (Boron Phosphorus Silicate Glass), PE-Oxide (Plasma Enhanced Oxide), USG(Undoped Silicate Glass), and HDP-Oxide (High Density Plasma Oxide).

In one embodiment, the device of the invention further includes a portion of a sacrificial layer pattern connected to the capacitor lower electrode and formed in a portion of the gap. The sacrificial layer can include at least one of a conductive layer and an oxide layer.

According to another aspect, the invention is directed to a method of fabricating a semiconductor device having a capacitor including forming a first insulating layer on a semiconductor substrate, the first insulating layer having a first contact hole exposing the semiconductor substrate. A contact plug is formed in the first contact hole, and a buffer conductive layer pattern is formed on the contact plug and the first insulating layer. A sacrificial layer pattern is formed on the buffer conductive layer pattern, and an etching stopping layer is formed on the sacrificial layer pattern. A second insulating layer is formed on the etching stopping layer. A second contact hole is formed by etching portions of the second insulating layer and the etching stopping layer to expose a portion of the sacrificial layer pattern. A portion of the sacrificial layer pattern is removed to expose the buffer conductive layer pattern and form a gap between the etching stopping layer and the buffer conductive layer pattern. A capacitor lower electrode is formed in the second contact hole and the gap.

The method may further comprise removing the second insulating layer to expose the outer sidewall of the capacitor lower electrode.

Forming a contact plug in the first contact hole and forming a buffer conductive layer pattern on the contact plug and the first insulating layer may be performed simultaneously.

The sacrificial layer may comprise at least one layer selected from the group consisting of a conductive layer and an oxide layer. The oxide layer may have a different etching rate than the second insulating layer. The conductive layer may comprise at least one of W and SiGe.

The contact plug and the buffer conductive layer pattern may be formed of the same material, which may be polysilicon.

The etching stopping layer can comprise a silicon nitride layer. The capacitor lower electrode can include a polysilicon layer.

Removing the portion of the sacrificial layer pattern to expose the buffer conductive layer pattern and form a gap between the etching stopping layer and the buffer conductive layer pattern is performed by a wet etching process. The wet etching process may be a SC1 etching process.

The second insulating layer can include at least one of PE-TEOS (Plasma Enhanced Tetraethyl Orthosilicate), BPSG (Boron Phosphorus Silicate Glass), PE-Oxide (Plasma Enhanced Oxide), USG(Undoped Silicate Glass), and HDP-Oxide (High Density Plasma Oxide).

The method may further comprise exposing a sidewall portion of the buffer conductive layer pattern. The capacitor lower electrode may have a cup-shaped storage node. The capacitor lower electrode may have a cylindrical storage node.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

The present invention will now be described more fully hereinafter with references to the accompanying drawings, in which exemplary embodiments of the invention are shown. It will be understood that when a layer is referred to as being "on" another layer or substrate, it can be directly on the other layer or substrate, or intervening layers may also be present. Further, it will be understood that when a layer is referred to as being "under" another layer, it can be directly under the other layer, or one or more intervening layers may also be present. In addition, it will also be understood that when a layer is referred to as being "between" two layers, it can be the only layer between the two layers, or one or more intervening layers may also be present. Further, throughout the drawings, a left portion of the figure illustrates a cell region of a semiconductor device and a right portion of the figure illustrates a peripheral circuit region of the semiconductor device.

FIGS. 2A through 2G show cross-sectional views of a semiconductor device formed by a method of fabricating a semiconductor device according to a first embodiment of the present invention.

Figure 1A:
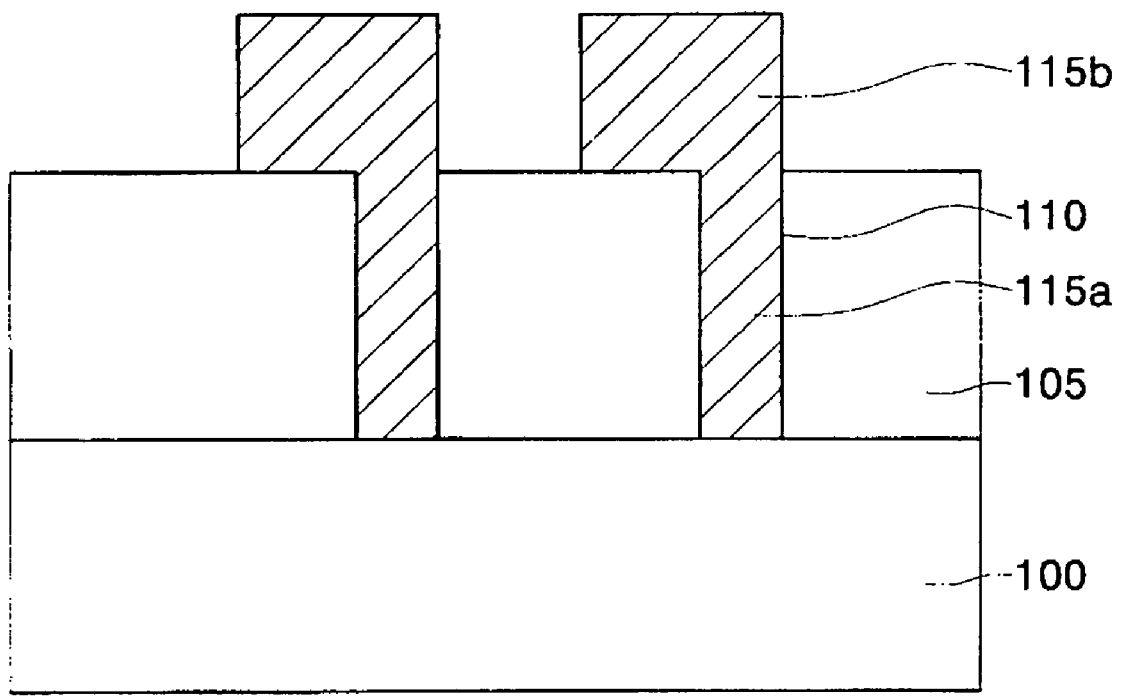
FIGS. 1A through 1E show cross-sectional views of a semiconductor device formed by a method of fabricating a semiconductor device according to prior art.
Figure 1B:
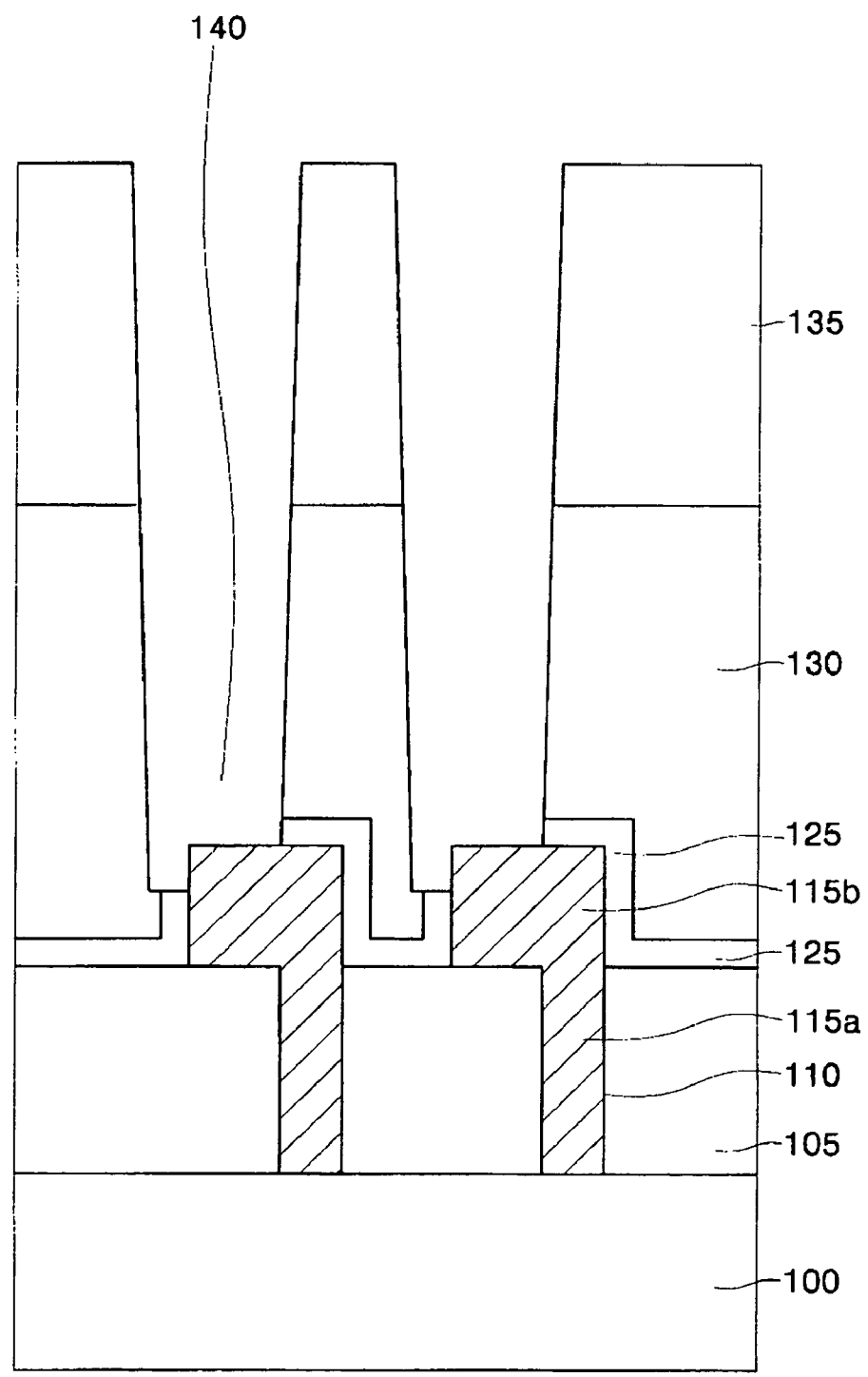
Figure 1C:
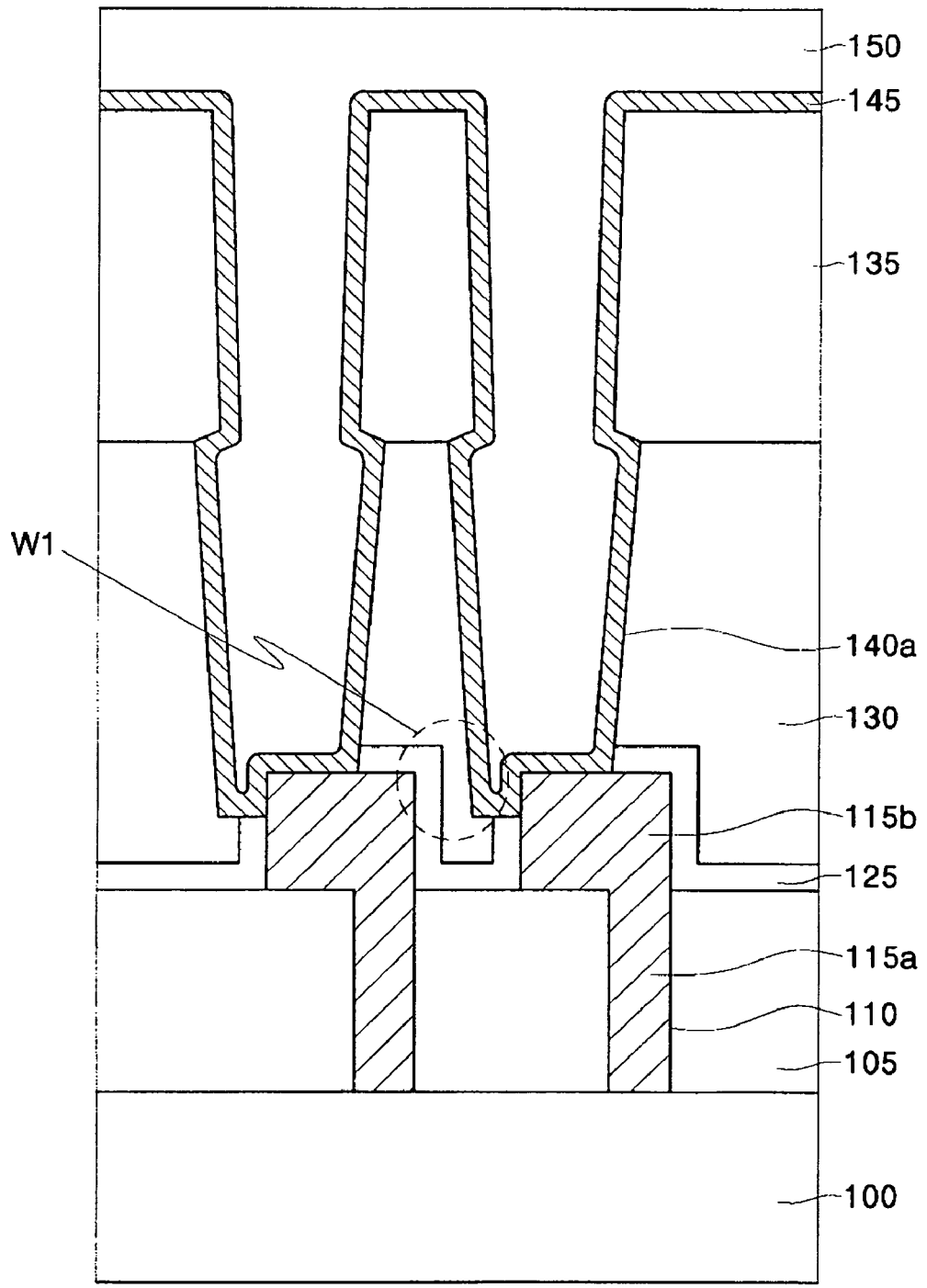
Figure 1D:
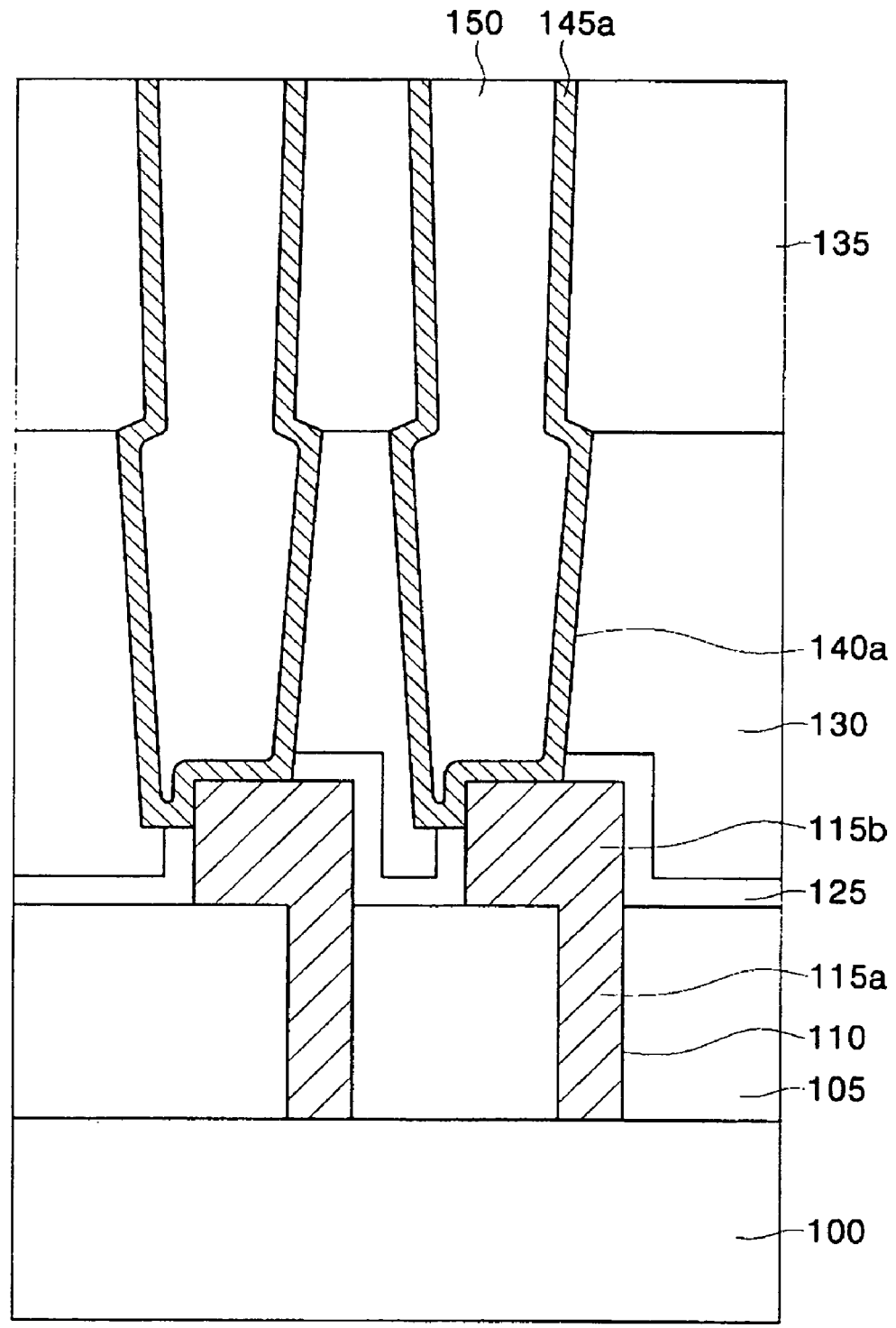
Figure 1E:
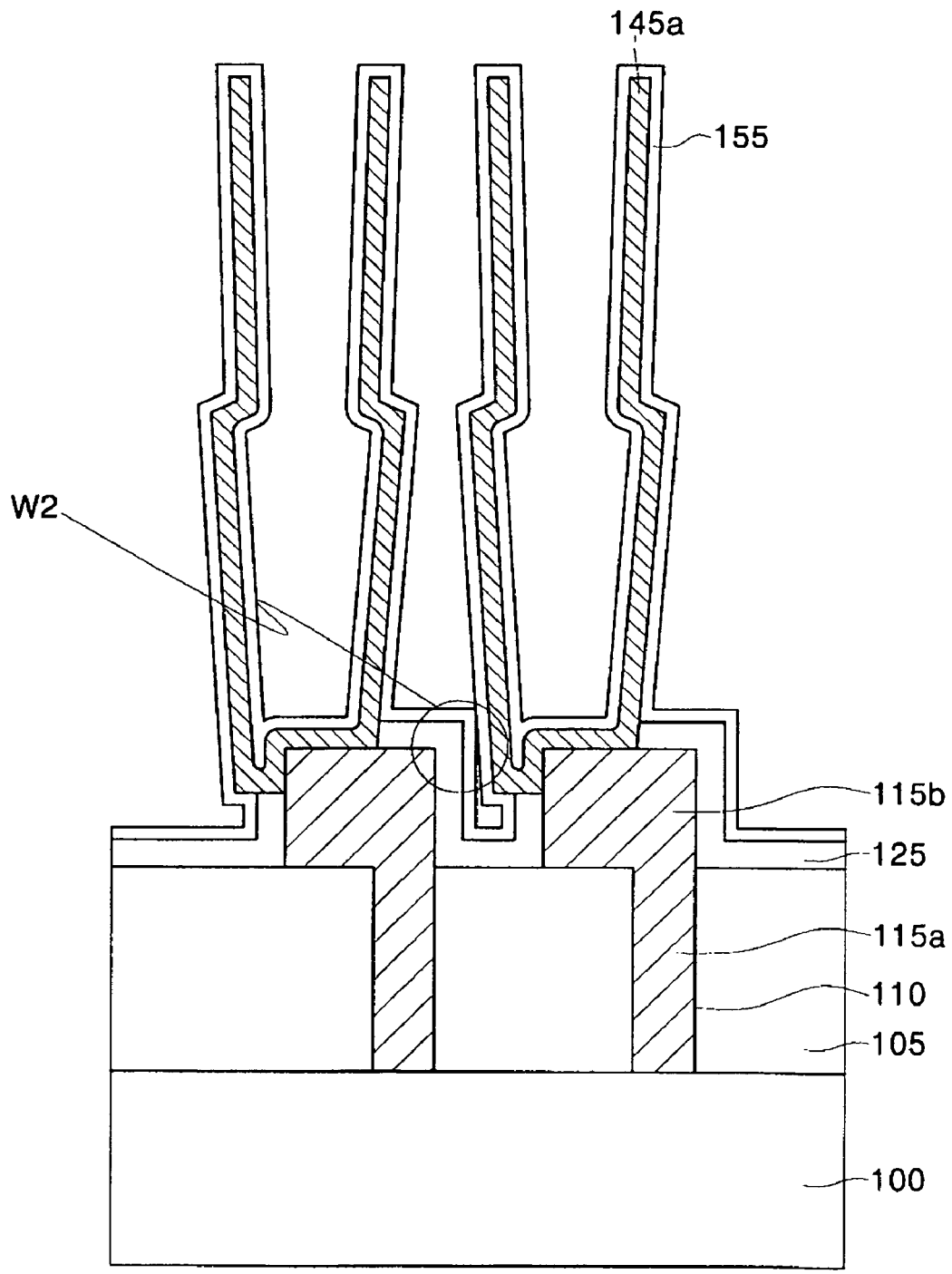
Figure 2A:
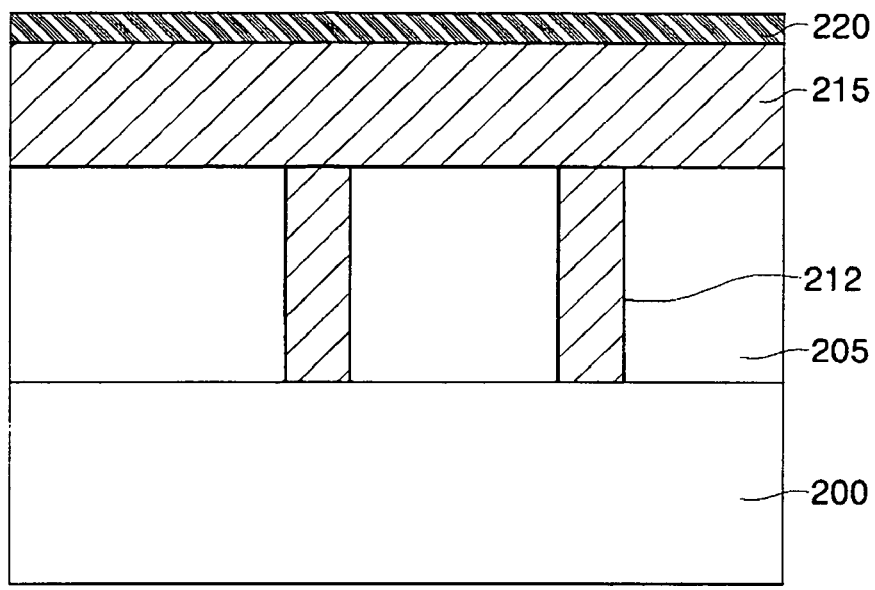
FIGS. 2A through 2G show cross-sectional views of a semiconductor device formed by a method of fabricating a semiconductor device according to a first embodiment of the present invention.

Referring to FIG. 2A, a first insulating layer 205 is formed on a semiconductor substrate 200. The first insulating layer 205 is formed using a silicon dioxide layer, BPSG (Boron Phosphorus Silicate Glass), or PSG (Phosphorus Silicate Glass). A first contact hole 210 is formed in the first insulating layer 205 to expose the semiconductor substrate 200 by patterning the first insulating layer 205. A contact plug 212 is formed in the first contact hole 210, and a buffer conductive layer 215 is formed on the contact plug 212 and the first insulating layer 215. The contact plug 212 and the buffer conductive layer 215 are formed using the same material, for example, a polysilicon layer. A sacrificial layer 220 is formed on the buffer conductive layer 215. The sacrificial layer 220 may be a metal layer or an oxide layer, for example, a Tungsten (W), Silicon Germanium (SiGe) or Silicon dioxide (SiO2) layer.

Figure 2B:
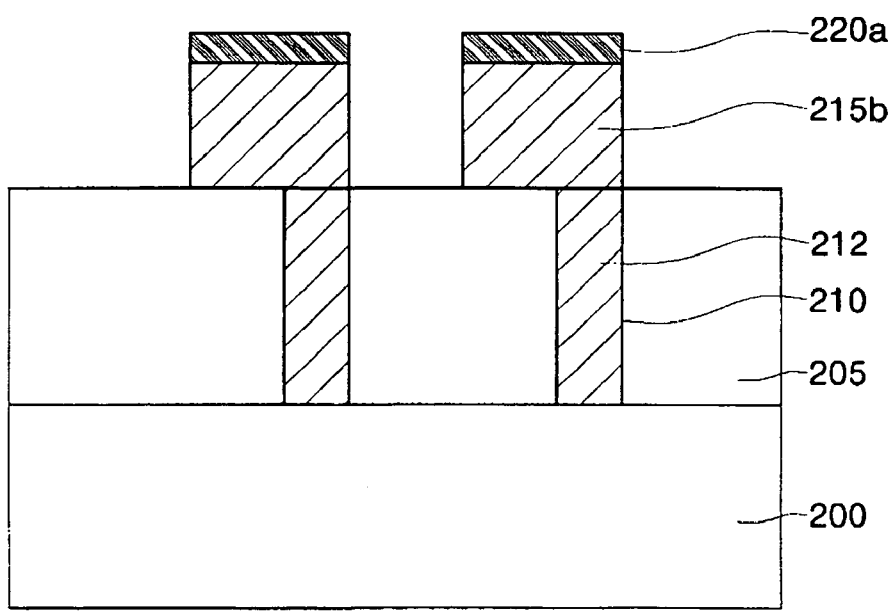

Referring to FIG. 2B, a buffer conductive layer pattern 215b and a sacrificial layer pattern 220a are formed by sequentially patterning the sacrificial layer 220 and the buffer conductive layer 215. The buffer conductive layer pattern 215b, which increases the surface conductive area of the contact plug 212, is formed to prevent a bad contact profile between the contact plug 212 and a storage node which will be formed on the contact plug 212. The contact plug 212 and the buffer conductive layer pattern 215b may be formed simultaneously by patterning a conductive layer after forming it in the first contact hole 210 and on the first insulating layer 205.

Figure 2C:
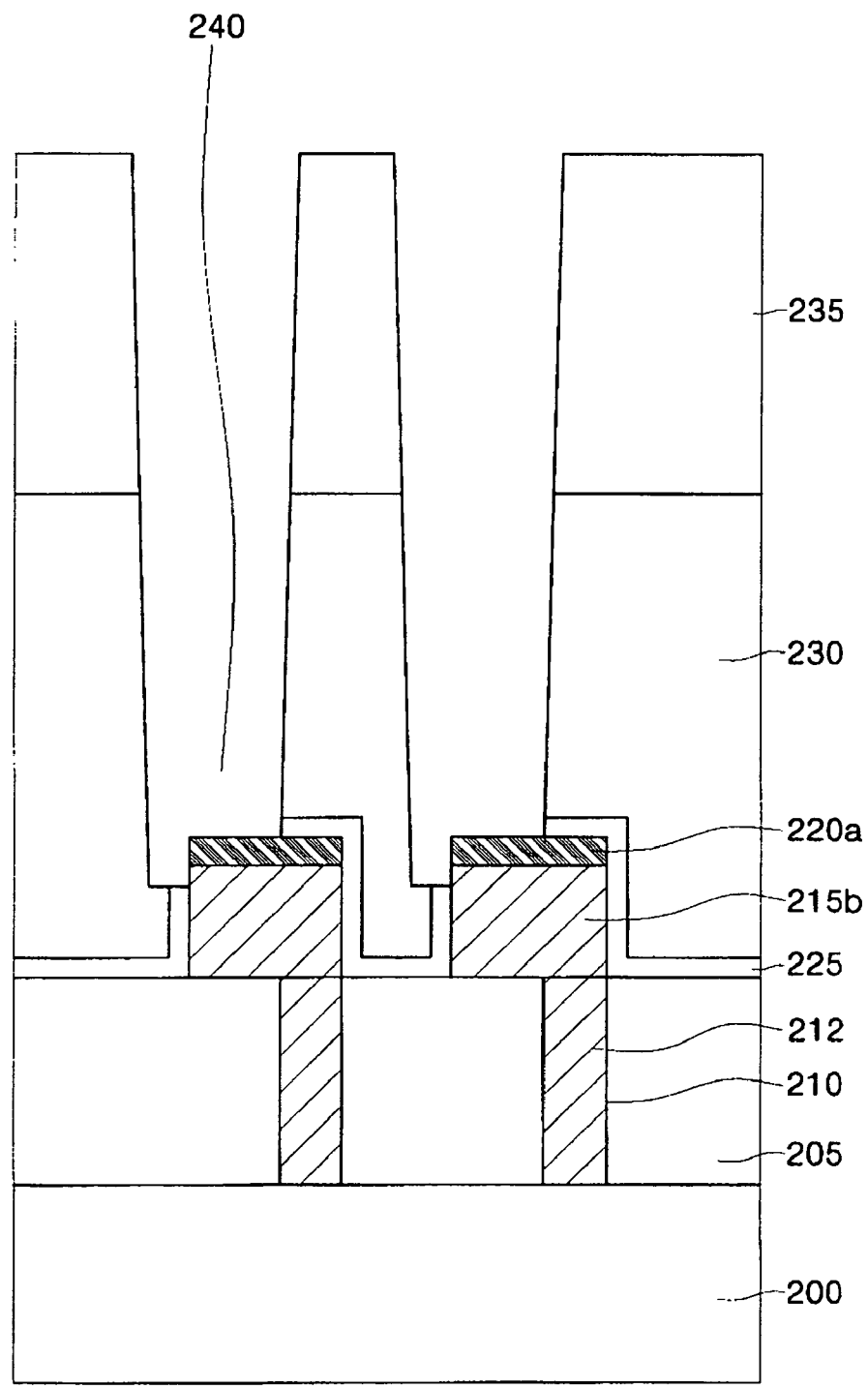

Referring to FIG. 2C, an etching stopping layer 225 is formed on the sacrificial layer pattern 220a and the exposed first insulating layer 205 after forming the sacrificial layer pattern 220a and the buffer conductive layer pattern 215b. The etching stopping layer 225 may be formed using a silicon nitride layer.

A second insulating layer is formed on the etching stopping layer 225. The second insulating layer may be formed using at least one or a laminated layer of a PE-TEOS (Plasma Enhanced Tetraethyl Orthosilicate), BPSG (Boron Phosphorus Silicate Glass), PE-OX (Plasma Enhanced Oxide), USG (Undoped Silicate Glass) and HDP-Oxide (High Density Plasma Oxide). The second insulating layer may be formed using laminated layers 230 and 235 as shown in FIG. 2C. In this case, the laminated layers 230 and 235 have different etching rates. For example, if one of the laminated layers is formed using a BPSG layer, the other of the laminated layers may be formed using PE-TEOS. Also, if the sacrificial layer 220a is formed using an oxide layer, the laminated layers 230, 235 may be formed using a layer having different etching rate compared to the oxide layer.

A second contact hole 240 is formed in the second insulating layer to expose the sacrificial layer pattern 220a by patterning the second insulating layer. A sidewall of the buffer conductive layer pattern 215b is exposed and a portion of a bottom area of the second contact hole 240 may not overlap with the sacrificial layer pattern 220a.

Figure 2D:
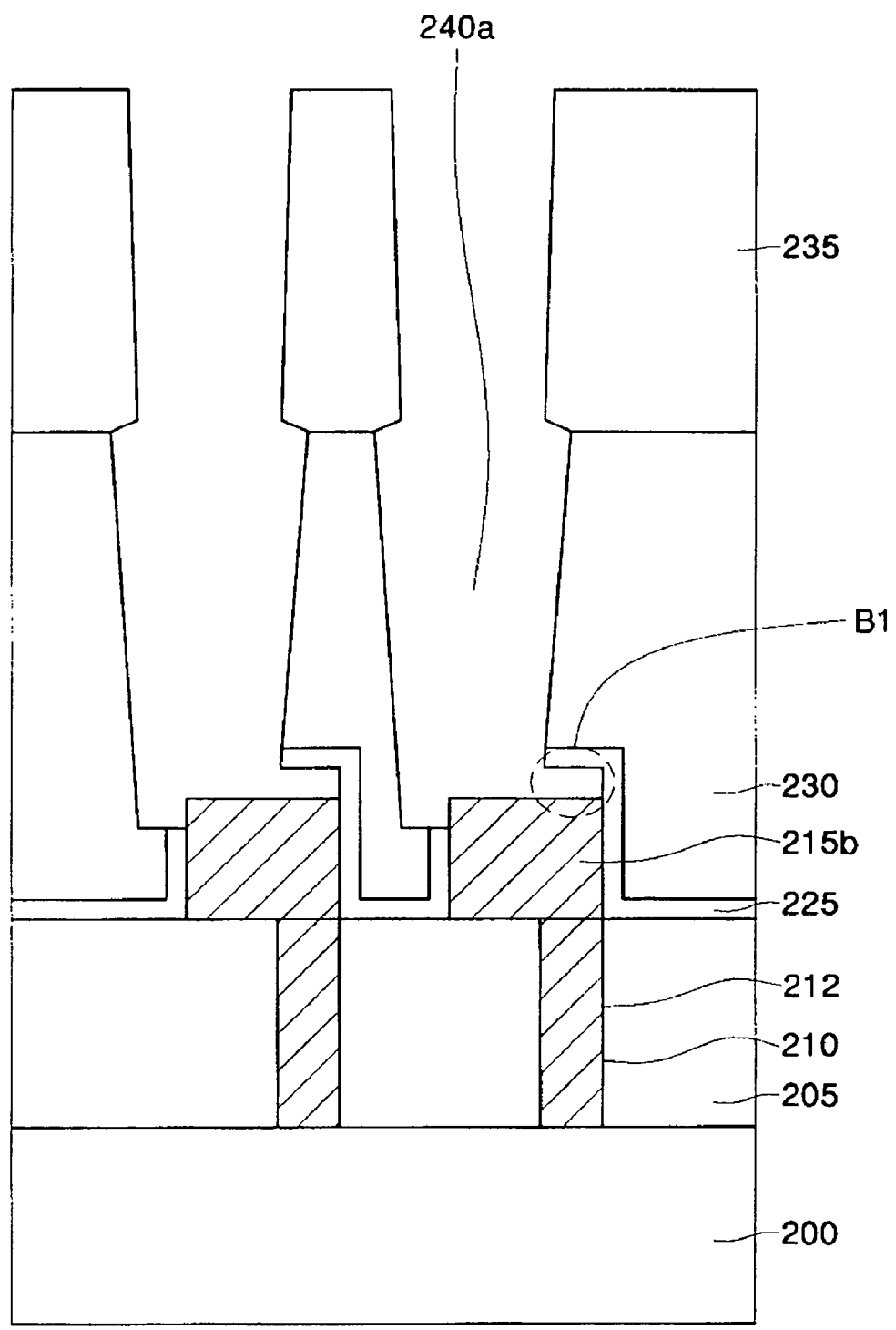

Referring to FIG. 2D, the sacrificial layer pattern 220a is removed by performing an etching process, for example, dipping the semiconductor having the exposed sacrificial layer pattern 220a into a wet chemical solution. As a result, a gap B1 is formed between the etching stopping layer 225 and the buffer conductive layer pattern 215b. If the sacrificial layer 220a is formed using tungsten (W) or silicon germanium (SiGe) layers, the sacrificial layer 220a may be removed using a SC1 chemical solution containing HF.

A cleaning process is performed to clean an oxide layer and any contamination which may have been formed on the buffer conductive layer pattern 215b in the natural environment and prior semiconductor processes. Generally, a chemical solution containing HF may be used as a cleaning solution. As a result of the cleaning process, the second contact hole 240 may be extended a small amount, thereby forming an extended second contact hole 240a.

In the present invention, the thickness of the etching stopping layer 225 is thinner than that of the prior art because the sacrificial layer 220a also functions as a etching stopping layer while the second insulating layer is etched to form the second contact hole 240. As a result, the present invention maintains a distance between the second contact hole 240 and the etching stopping layer 225 formed on an adjacent buffer conductive layer pattern 215b.

Figure 2E:
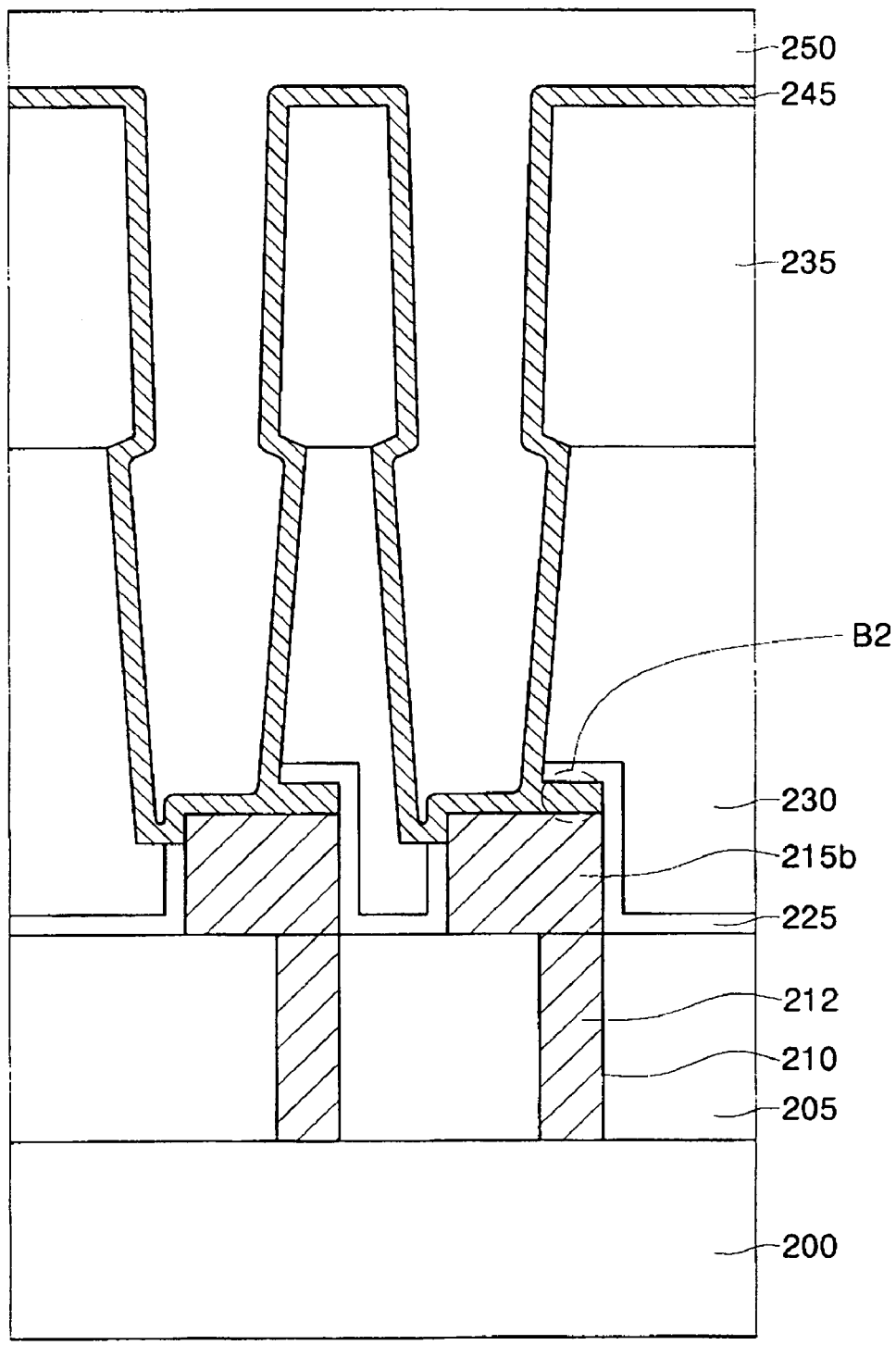

Referring to FIG. 2E, a capacitor lower electrode layer 245 is formed in the extended second contact hole 240a and on the second insulating layer. The capacitor lower electrode layer 245 may be formed using a polysilicon layer having a good deposition characteristic. Thus, a portion of the lower capacitor electrode layer 245 is formed in the gap B1 as indicated by the circle B2. The portion that is formed in the gap prevents the capacitor lower electrode from leaning after the second insulating layer and a third insulating layer which will be formed are removed.

A third insulating layer 250 is formed on the capacitor lower electrode layer 245. The third insulating layer 250 may be formed using an oxide layer, BPSG, or PSG layers.

Figure 2F:
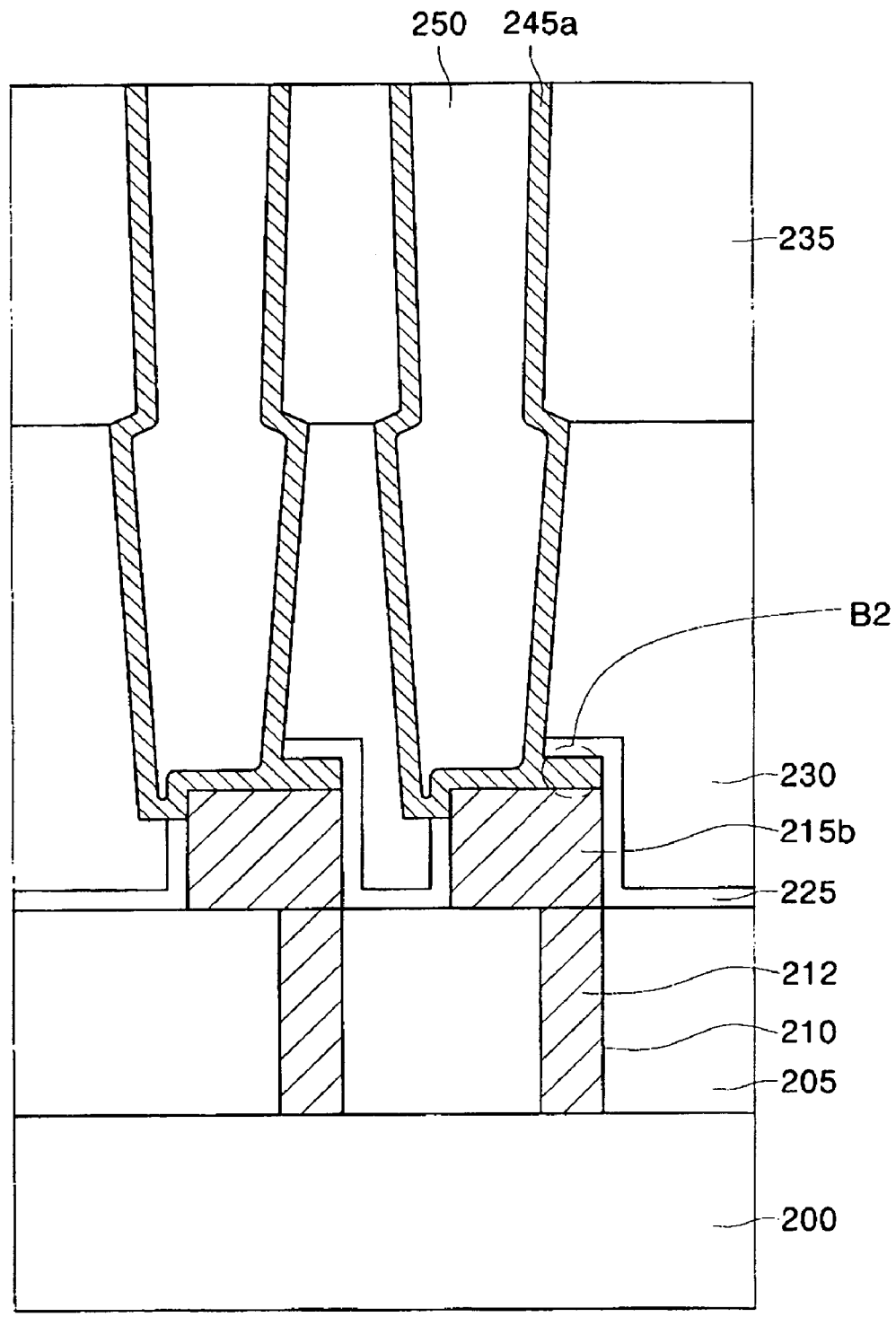

Referring to FIG. 2F, a separated capacitor lower electrode 245a is formed by planarizing the third insulating layer 250 to expose the second insulating layer. The planarizing method may be a CMP (Chemical Mechanical Polishing) process or an etching back process.

Figure 2G:
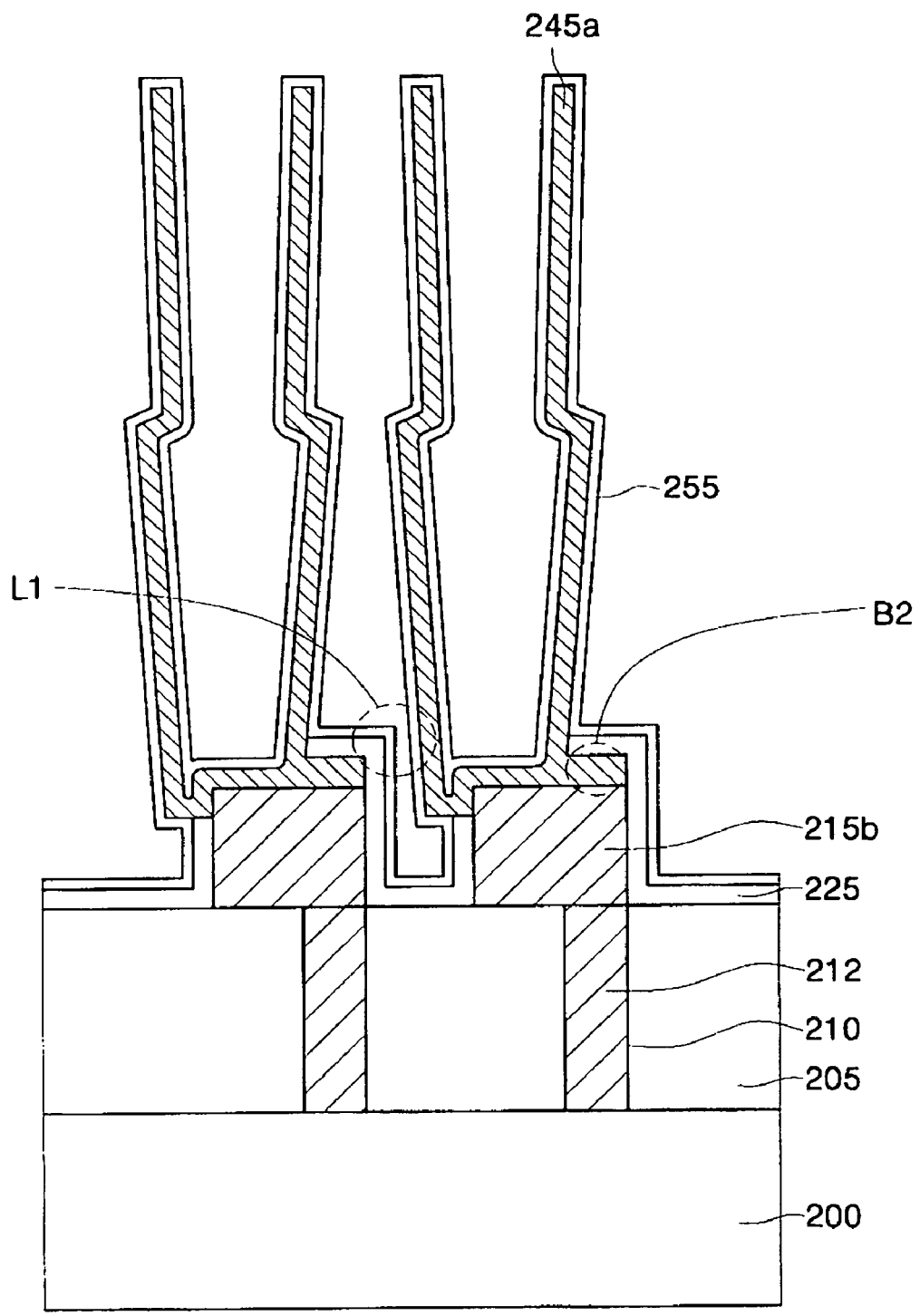

Referring to FIG. 2G, the outer and inner sidewalls of the separated capacitor lower electrodes 245a are exposed by removing the second and third insulating layers. A portion B2 of the capacitor lower electrode 245a formed in the gap B1 prevents the separated capacitor lower electrode 245a from leaning during the following processes.

A dielectric layer 255 is formed on the surface of the separated capacitor lower electrodes 245a. The capacitor of the present invention defines a distance between the separated capacitor lower electrode 245a and the etching stopping layer 225 formed on an adjacent buffer conductive layer pattern, as shown in circle L1 in FIG. 2G.

Therefore, the present invention prevents capacitance of the separated capacitor lower electrode 245a from decreasing its surface area. As a result, the present invention provides a capacitor without the reduced capacitance in capacitors of the prior art.

FIGS. 3A through 3D show cross-sectional views of a semiconductor device formed by a method of fabricating a semiconductor device according to a second embodiment of the present invention.

Figure 3A:
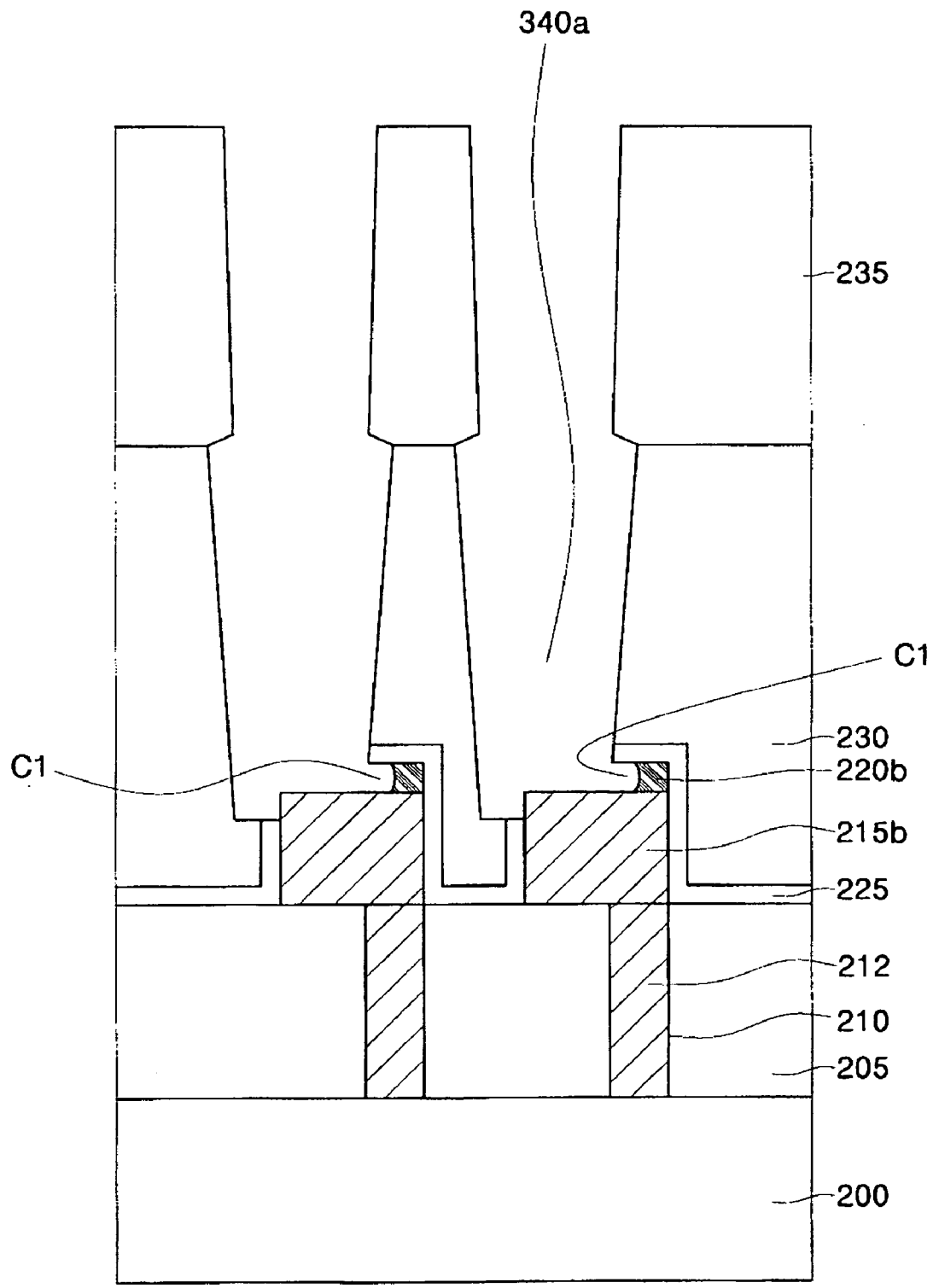
FIGS. 3A through 3D show cross-sectional views of a semiconductor device formed by a method of fabricating a semiconductor device according to a second embodiment of the present invention.

Referring to FIG. 3A, in the second embodiment of the invention, the same process steps performed in the first embodiment as described above are performed until the second contact hole 240 is formed (see FIGS. 2A through 2C). Next, an extended second contact hole 340a is formed by removing a portion of the sacrificial layer pattern 220a. As a result, a gap C1 and a reduced sacrificial layer pattern 220b are formed between the buffer conductive layer pattern 215b and the etching stopping layer 225. An etching chemical solution may be used for removing the portion of the sacrificial layer pattern 220b. For example, if the sacrificial layer is formed using tungsten (W) or silicon germanium layers, the etching chemical solution may comprise SC1.

Figure 3B:
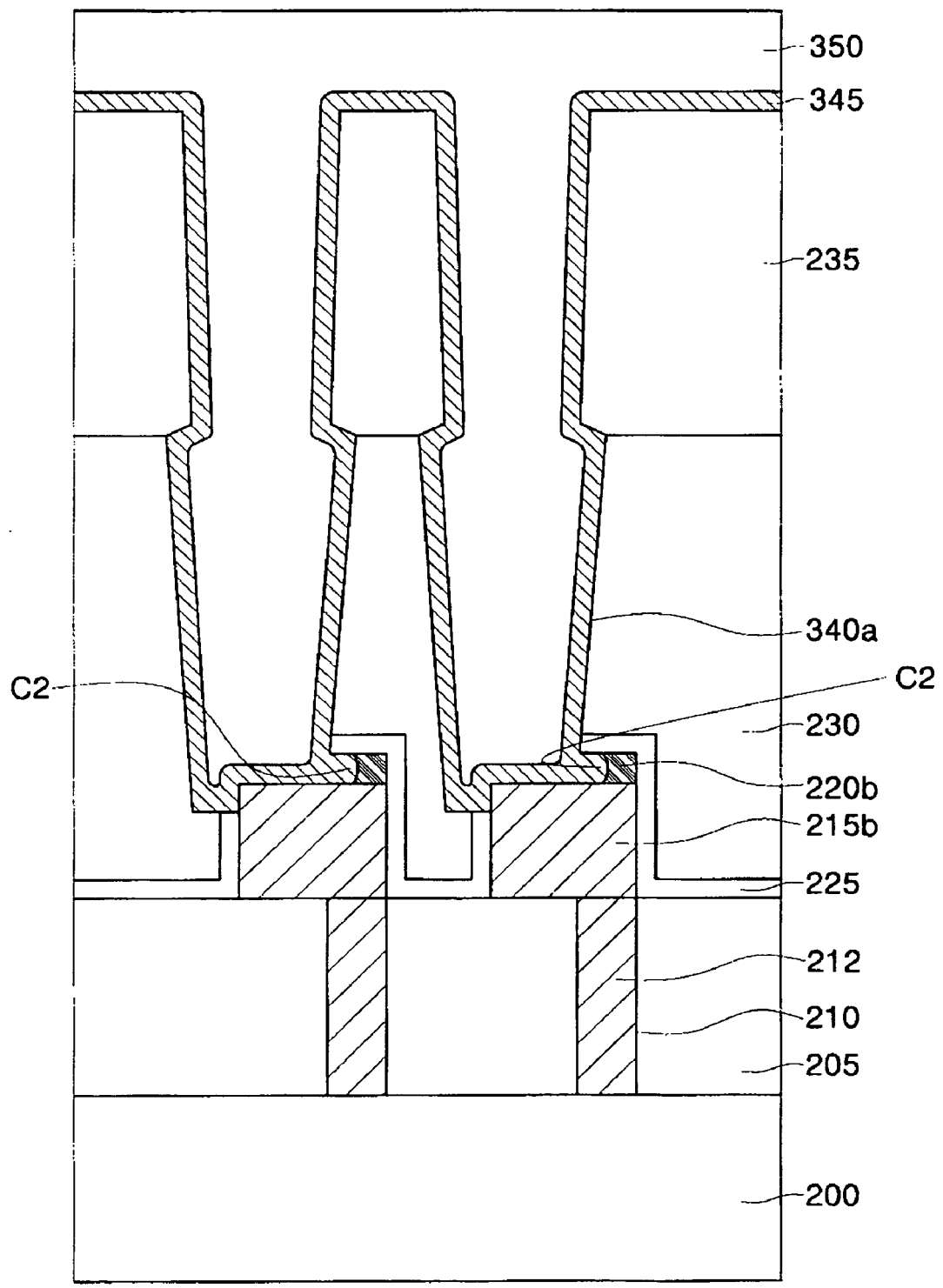

Referring to FIG. 3B, a capacitor lower electrode layer 345 is formed in the extended second contact hole 340a and on the second insulating layer (230 and 235).

The capacitor lower electrode layer 345 may comprise polysilicon layer having a good deposition characteristic. Therefore, a portion C2 of the capacitor lower electrode layer fills the gap C1.

A third insulating layer 350 is formed on the capacitor lower electrode layer 345. The third insulating layer may be formed using a silicon dioxide, BPSG, or PSG layers.

Figure 3C:
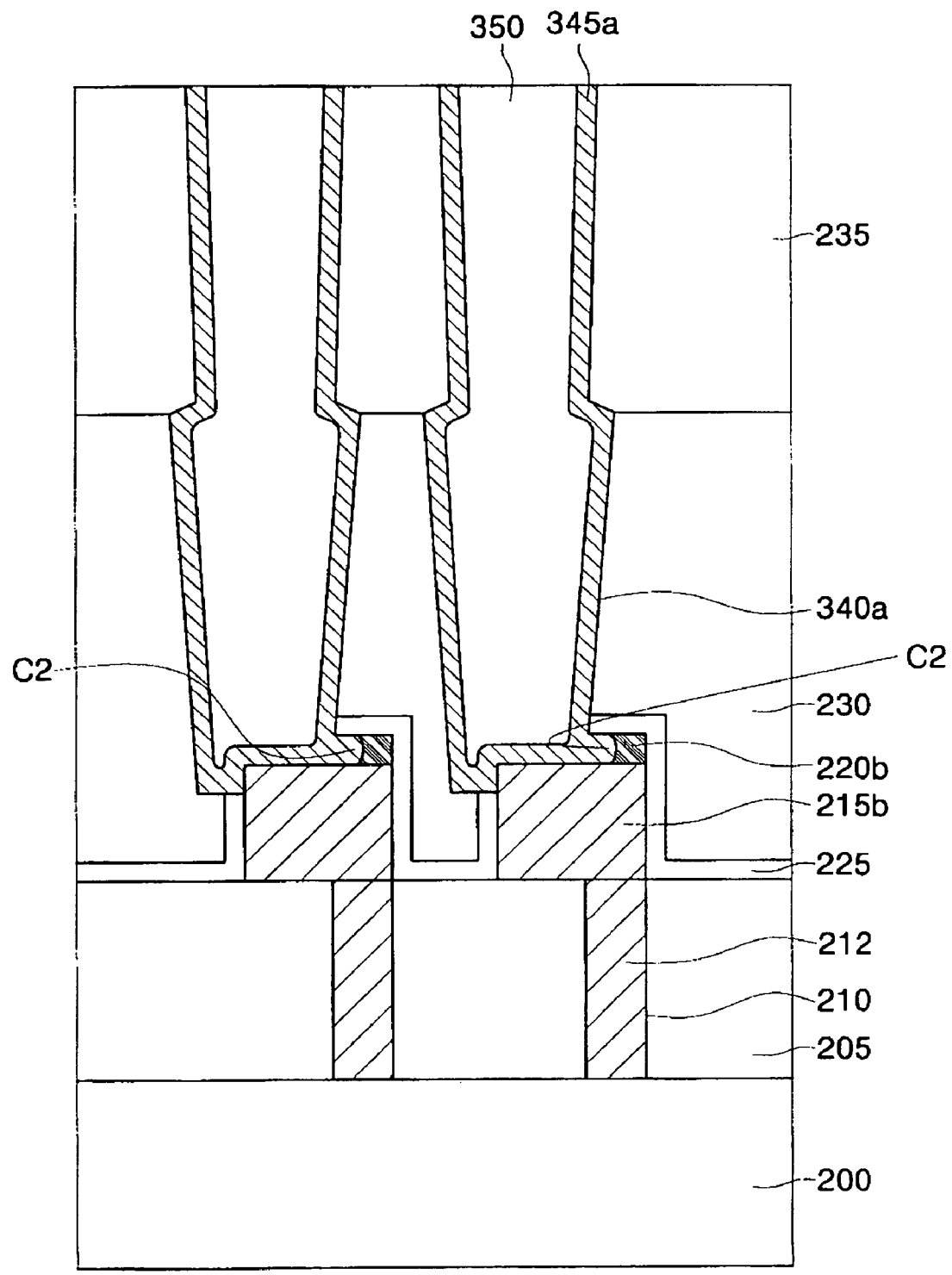

Referring to FIG. 3C, a separated capacitor lower electrode 345a is formed by planarizing the third insulating layer 350 until the second insulating layer is exposed. The planarizing process may be performed using an etching back process or a CMP process.

Figure 3D:
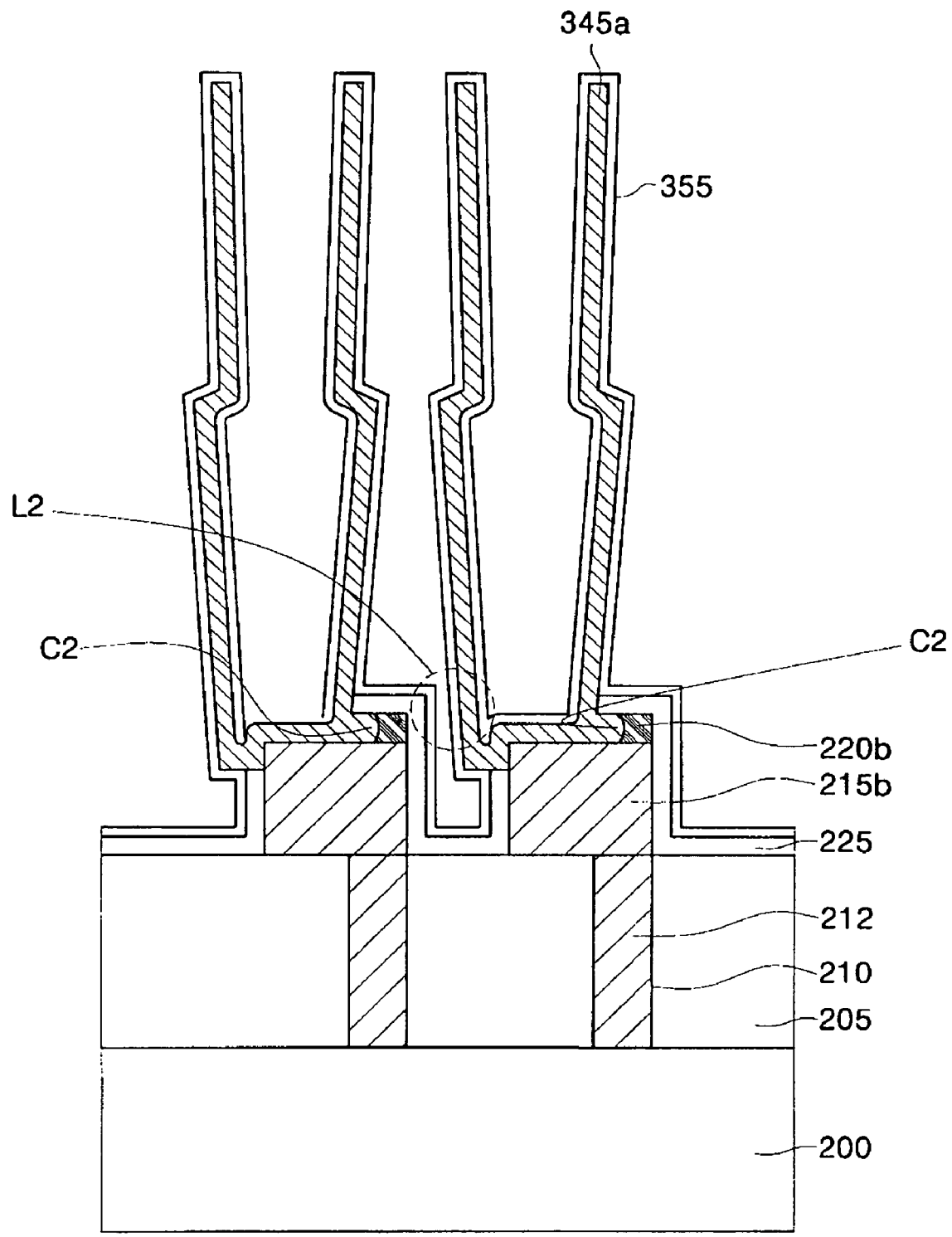

Referring to FIG. 3D, in order to expose sidewalls of the separated capacitor lower electrode 345a, the second and third insulating layers are removed. A portion C2 of the separated capacitor lower electrode formed in the gap C1 prevents the capacitor lower electrode from leaning during the subsequent processes.

A dielectric layer 355 is formed on the surface of the separated capacitor lower electrode 345a. The capacitor structure of the present invention defines a distance between the separated capacitor lower electrode 345a and the etching stopping layer 225 formed on an adjacent buffer conductive layer pattern (see L2 in FIG. 3D).

Therefore, the present invention prevents capacitance of the separated capacitor lower electrode 345a from decreasing due to decreased surface area. That is, in the present invention, capacitance of a capacitor is not decreased as in the prior art.

FIGS. 2G and 3D illustrate semiconductor devices having capacitors according to the present invention.

FIG. 2G shows a cross-sectional view of a semiconductor device having a capacitor formed by a fabricating method according to one of the embodiments of the present invention.

Referring to FIG. 2G, an insulating layer 205 having a first contact hole 210 is formed on a semiconductor substrate 200. A contact plug 212 electrically connected to the semiconductor substrate is formed in the first contact hole 210. A buffer conductive layer pattern 215b, which is electrically connected to the contact plug 212, having a larger top surface area than the contact plug 212, is formed on the contact plug 212 and the first insulating layer 205. The contact plug 212 and the buffer conductive layer pattern 215b may be formed of the same material, for example, a polysilicon layer.

An etching stopping layer 225 is formed on the buffer conductive layer pattern 215b and a gap is formed between the etching stopping layer 225 and the buffer conductive layer pattern 215b. The etching stopping layer 225 may be formed using a silicon nitride layer.

A capacitor lower electrode 245a, penetrating the etching stopping layer 225 and filling the gap, is formed on the buffer conductive layer pattern 215b. The capacitor lower electrode 245a protrudes from the buffer conductive layer pattern 215b, and a portion of the capacitor lower electrode 245a is connected to a sidewall of the buffer conductive layer pattern 215b. The capacitor lower electrode 245a may be formed using a polysilicon layer.

A dielectric layer 255 is formed on the capacitor lower electrode 245a. The dielectric layer 255 may be formed using a silicon dioxide or a metal oxide. A capacitor upper electrode (not shown) may be formed on the dielectric layer 255.

FIG. 3D shows a cross-sectional view of a semiconductor device having a capacitor formed by a fabricating method according to another embodiment of the present invention, Referring to FIG. 3D, an insulating layer 205 having a first contact hole 210 is formed on a semiconductor substrate 200. A contact plug 212 electrically connected to the semiconductor substrate 200 is formed in the first contact hole 210. A buffer conductive layer pattern 215b, which is electrically connected to the contact plug 212, having a larger top surface area than the contact plug 212, is formed on the contact plug 212 and the first insulating layer 205. The contact plug 212 and the buffer conductive layer pattern 215b may be formed of the same material, for example, a polysilicon layer.

An etching stopping layer 225 is formed on the buffer conductive layer pattern 215b and a gap is formed between the etching stopping layer 225 and the buffer conductive layer pattern 215b. The etching stopping layer 225 may be formed using a silicon nitride layer.

A capacitor lower electrode 345a, which penetrates the etching stopping layer 225 and fills the gap, is formed on the buffer conductive layer pattern 215b. A portion of a sacrificial layer pattern 220b which is connected to a portion of the capacitor lower electrode 345a filling the gap is formed in the gap. The portion of the sacrificial layer pattern 220b may be formed using an oxide layer or metal layer. The metal layer may be tungsten or silicon germanium layers.

The capacitor lower electrode 345a protrudes from the buffer conductive layer pattern 215b, and a portion of the capacitor lower electrode 345a is connected to a sidewall of the buffer conductive layer pattern 215b. The capacitor lower electrode 345a may be formed using a polysilicon layer. A dielectric layer 355 is formed on the capacitor lower electrode 345a. The dielectric layer 355 may be formed using a silicon dioxide or a metal oxide. A capacitor upper electrode (Not shown) may be formed on the dielectric layer 355.

As described, in comparison to the prior art, the portion of the capacitor lower electrode 345a that fills the gap prevents the capacitor lower electrode from leaning during subsequent processing steps.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device having a capacitor, comprising:
    forming on a semiconductor substrate a first insulating layer having a first contact hole exposing the semiconductor substrate;
    forming a contact plug in the first contact hole;
    forming a buffer conductive layer pattern on the contact plug and the first insulating layer;
    forming a sacrificial layer pattern on the buffer conductive layer pattern;
    forming an etching stopping layer on the sacrificial layer pattern;
    forming a second insulating layer on the etching stopping layer;
    forming a second contact hole by etching portions of the second insulating layer and the etching stopping layer to expose a portion of the sacrificial layer pattern;
    removing a portion of the sacrificial layer pattern to expose the buffer conductive layer pattern and form a gap between the etching stopping layer and the buffer conductive layer pattern; and
    forming a capacitor lower electrode in the second contact hole and the gap.

2. A method according to claim 1, further comprising:
    removing the second insulating layer and the third insulating layer to expose the outer sidewall of the capacitor lower electrode.

3. A method according to claim 1, wherein forming a contact plug in the first contact hole and forming a buffer conductive layer pattern on the contact plug and the first insulating layer are performed simultaneously.

4. A method according to claim 3, wherein the contact plug and the buffer conductive layer pattern are formed with the same material.

5. A method according to claim 4, wherein the contact plug and the buffer conductive layer pattern comprise a polysilicon layer.

6. A method according to claim 1, wherein the etching stopping layer comprises a silicon nitride layer.

7. A method according to claim 1, wherein the capacitor lower electrode comprises a polysilicon layer.

8. A method according to claim 1, wherein the sacrificial layer pattern comprises at least one layer selected from the group consisting of a conductive layer and an oxide layer.

9. A method according to claim 8, wherein the conductive layer comprises at least one material selected from the group consisting of W and SiGe.

10. A method according to claim 8, wherein the oxide layer has a different etching rate than the second insulating layer.

11. A method according to claim 1, wherein removing the portion of the sacrificial layer pattern to expose the buffer conductive layer pattern and form a gap between the etching stopping layer and the buffer conductive layer pattern is performed by a wet etching process.

12. A method according to claim 11, wherein the wet etching process is performed using a SC1 chemical.

13. A method according to claim 1, wherein the second insulating layer comprises at least one material selected from the group consisting of PE-TEOS (Plasma Enhanced Tetraethyl Orthosilicate), BPSG (Boron Phosphorus Silicate Glass), PE-Oxide (Plasma Enhanced Oxide), USG(Undoped Silicate Glass), and HDP-Oxide (High Density Plasma Oxide).

14. A method according to claim 1, further comprising exposing a sidewall portion of the buffer conductive layer pattern.

15. A method according to claim 1, wherein the capacitor lower electrode has a cup-shaped storage node.

16. A method according to claim 1, wherein the capacitor lower electrode has a cylindrical storage node.

* * * * *